United States Patent
Kawai

[19]

[11] Patent Number: 6,137,846
[45] Date of Patent: Oct. 24, 2000

[54] AFC CIRCUIT FOR A FREQUENCY SCANNING FSK RECEIVER

[75] Inventor: Kazuo Kawai, Tokyo, Japan

[73] Assignee: General Research of Electronics, Inc., Tokyo, Japan

[21] Appl. No.: 09/040,076

[22] Filed: Mar. 17, 1998

[30]  Foreign Application Priority Data

Nov. 13, 1997  [JP]  Japan .................................. 9-329461

[51] Int. Cl.$^7$ .................................................. H04L 27/06
[52] U.S. Cl. .......................... 375/344; 375/326; 375/327; 375/344; 331/4
[58] Field of Search .................................. 375/344, 334, 375/326, 327; 455/208, 260, 263; 329/302; 331/4

[56] References Cited

U.S. PATENT DOCUMENTS

| | | | |
|---|---|---|---|
| 3,978,411 | 8/1976 | Sakamoto | 455/167.1 |
| 4,152,650 | 5/1979 | Bennett, Jr. | 380/38 |
| 4,271,434 | 6/1981 | Sakamoto | 348/732 |
| 4,423,390 | 12/1983 | Waters | 331/4 |
| 5,717,721 | 2/1998 | Kawai | 375/326 |
| 5,881,111 | 3/1999 | Anzai | 375/327 |
| 5,949,829 | 9/1999 | Kawai | 375/334 |

*Primary Examiner*—Stephen Chin
*Assistant Examiner*—Paul N Rupert
*Attorney, Agent, or Firm*—Trexler, Bushnell, Giangiorgi & Blackstone, Ltd.

[57]  ABSTRACT

An AFC circuit for a frequency scanning FSK receiver is so constructed that through put of data which can be transmitted is improved by shortening a header of a packet signal owing to the fact that frequency errors remaining when an object signal is caught by the frequency scanning and the frequency scanning is stopped are eliminated in a short period of time.

In the frequency scanning FSK receiver having an AFC function, the scanning is stopped, when either one of upper and lower side band waves of a bit synchronizing signal of a desired signal is caught by the frequency scanning by means of a VCO, to which a scanning voltage from a scanning signal generator is applied. An operating circuit calculates a set voltage applied to the VCO at the AFC convergence to form it on the basis of a control voltage (scanning voltage) applied to the VCO at that time and a control sensitivity thereof as well as a detection voltage and a detection sensitivity of a frequency error detector at that time. The AFC circuit is made active after having applied this set voltage to the VCO.

3 Claims, 4 Drawing Sheets

AFC CIRCUIT FOR A FREQUENCY SCANNING FSK RECEIVER

FIELD OF THE INVENTION

The present invention relates to an improvement of a receiver for packet FSK (Packet Frequency Shift Keying) signals having a frequency scanning function and an AFC (Automatic Frequency Control) function, and in particular to a circuit construction for improving the response time of an AFC circuit, in changing over the function so that the AFC circuit becomes active at the same time that the frequency scanning is stopped, when an object signal is caught by the frequency scanning at the beginning of reception.

DESCRIPTION OF THE PRIOR ART

In the case where an FSK signal of packet construction is received by a receiver having a frequency scanning function and an AFC function, the receiver is usually such constructed such that when the frequency of an object signal is not within the intermediate frequency band, frequency scanning is started, and when the object signal is caught by this scanning (when it enters the IF band), the frequency scanning function is switched over to the AFC function so that the AFC circuit becomes active at the same time that the frequency scanning is stopped. Almost all the prior art FSK receivers are constructed such that, since frequency errors remain when this switching-over is effected, they work so that these remaining frequency errors are eliminated thereafter by the function of the AFC circuit. Since the duration required for terminating correction of these remaining frequency errors is determined by response characteristics themselves which the AFC circuit itself has, the length of the synchronizing signal put at the heading of the packet (usually a bit synchronizing signal for the FSK signal) is set, taking this response time of the AFC circuit into account.

As described above, by the prior art techniques, since the length of the bit synchronizing signal is set, taking the response time of the AFC circuit into account, if it is possible to make initial response of the AFC circuit faster, this bit synchronizing signal can be made shorter, which gives improves data transmission efficiency.

Therefore, in order to shorten the length of the bit synchronizing signal, it is sufficient to design an AFC system so that it is set in a convergent state as soon as a desired object signal is caught.

In other words, the point described above can be expressed as follows.

In a frequency scanning FSK receiver with AFC, if the AFC function is turned on, when an object signal is caught by the frequency scanning, in almost all the cases, it is caught not at the center of an IF filter and there are remaining frequency errors. Therefore, the duration required for eliminating the errors by moving the signal to the center of the IF filter is determined primarily by response characteristics of the AFC circuit. Although, from the point of view of stability of control, it is preferable that the response characteristics of the AFC circuit are not quickly responsive, it is a matter of course that they are preferably quickly responsive at catching a first signal. These two requirements are contradictory to each other.

SUMMARY OF THE INVENTION

Therefore the two requirements can be solved by constructing the receiver so that the AFC circuit is set at a convergent value and thereafter it is made active in an extremely short time, independently from the response characteristics thereof, when the signal is caught.

An object of the present invention is to provide an AFC circuit for a frequency scanning FSK receiver, which can realize the above described method.

In order to achieve the above object, an AFC circuit for a frequency scanning FSK receiver according to the present invention, comprising a voltage controlled oscillator generating a frequency scanning signal; a frequency converter generating an intermediate frequency signal having a frequency error signal, staring from a received signal and the frequency scanning signal; a frequency discriminator detecting the frequency error signal; and a signal detector judging presence or absence of a desired received signal, based on a detection output of the frequency discriminator or an output of a signal strength indicator obtained from an intermediate frequency amplifier; in which a control voltage is given to the voltage controlled oscillator, responding to a judgment output of the signal detector, so as to stop the frequency scanning and to make the AFC circuit active, is characterized in that it comprises further an error voltage detecting circuit outputting a frequency error voltage, depending on a detection output of the frequency discriminator corresponding to a bit synchronizing signal of an object signal at stopping the scanning; and an operating circuit, which calculates the control voltage at AFC convergence, starting from the frequency error voltage and the control voltage applied to the voltage controlled oscillator, to transmit it to the voltage controlled oscillator.

According to the present invention, the error voltage detecting circuit may be constructed so as to output a frequency error voltage, depending on the detection output of the frequency discriminator corresponding to either one of an upper and a lower side band of the bit synchronizing signal.

Or the error voltage detecting circuit may be constructed so as to output a frequency error voltage obtained by integrating a detection output of the frequency discriminator corresponding to either one of an upper and a lower side band of the bit synchronizing signal and a carrier over a 2 bit length.

DESCRIPTION OF THE PREFERRED EMBODIMENTS

Figure 1:
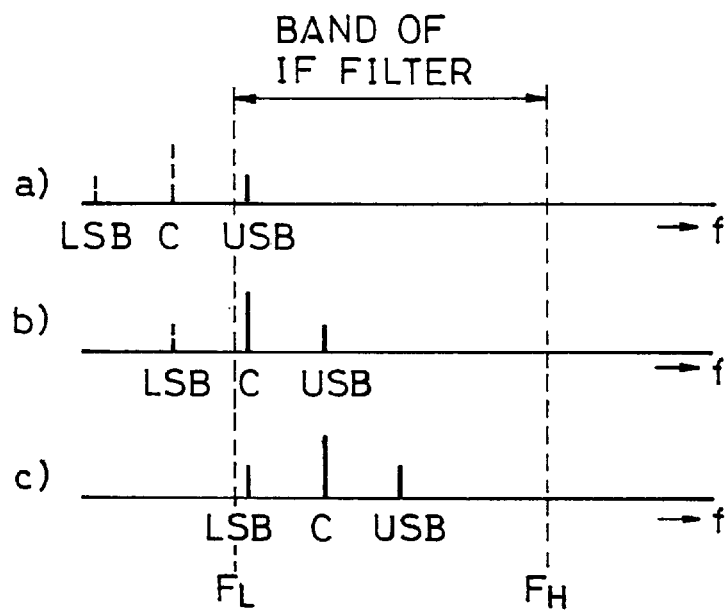
FIG. 1 is a diagram showing a spectrum of an inputted FSK signal for explaining an operation of the present invention.

An AFC circuit for a frequency scanning FSK receiver comprises a voltage controlled oscillator (VCO) generating a frequency scanning signal; a frequency converter a frequency error signal, starting from a received signal and the frequency scanning signal; a frequency discriminator detecting the frequency error signal; and a signal detector judging presence or absence of a desired received signal, based on a detection output of the frequency discriminator or an output of a signal strength indicator obtained from an intermediate frequency amplifier, in which a control voltage is given to the voltage controlled oscillator, responding to a judgment output of the signal detector, so as to stop frequency scanning.

Consequently, in order to achieve the object of the present invention, an operating circuit so described below may be added thereto.

That is, the frequency scanning is stopped, when a signal detector detects that an object signal has been caught by the scanning and since it is possible to store temporarily a driving voltage of the VCO just before this scanning has been stopped and a frequency error voltage generated at the output of the frequency discriminator at the same point of time, a true frequency error of the received signal can be known on the basis of these two voltages the modulation sensitivity of the VCO and the error detection sensitivity of the frequency discriminator, which are previously known. When this frequency error is known, the AFC should be converged at a point obtained by correcting the frequency error by a factor of 1 divided by (1+loop gain). The VCO driving voltage for achieving this convergent value can be calculated and formed by using the two voltages stored temporarily, which are the VCO driving voltage at stopping the scanning and the frequency error voltage which is the output of the discriminator, and a weight determined by the modulation sensitivity and the error detection sensitivity. Therefore, when the signal is caught and the scanning is stopped, this operation may be effected and the VCO frequency may be set at the frequency at the AFC convergence. The AFC loop may be constructed after this setting.

In this case, problems when the frequency scanning is stopped and how the frequency error is detected take place. This is because phenomena as described below are produced.

That is, when a packet narrow deviation FSK signal is received while scanning the frequency, since side band waves of the bit synchronizing signal enter the IF filter one after another, as conditions of the signal, at first a condition, in which only either one of upper and lower one side band waves of the bit synchronizing signal is received, (called condition a) is produced, then it is changed to another condition, in which the one side band wave and the carrier, (called condition b) are received, and finally still another condition, in which all the upper and lower one side band waves and the carrier, (called condition c) is realized.

In the case where frequency errors are detected from a part under the condition a), the frequency should be corrected by a frequency difference from the carrier due to the fact that the signal is the one side band wave.

In the case where the frequency errors are detected from a part under the condition b) or c), since the bit synchronizing signal component is demodulated simultaneously, the detection output should be integrated over a 2 bit length.

On the basis of the items described above, as a mode of realization of the AFC circuit for a frequency scanning receiver according to the present invention, concretely speaking, a circuit for carrying out an operating method as described below is added thereto.

It is recognized by the signal detecting function that an object signal has been caught and therefor there are known such a method that presence or absence of the signal is judged by using noise outside of the band of the output of the frequency discriminator (called carrier detection CD or squelch SQ) and a method, by which presence or absence of the object signal is judged by using a received signal strength indicator RSSI current proportional to a signal strength obtained from the IF amplifier. For realizing the present invention, it is a matter of course that any method can be used therefor, so long as presence or absence of the signal can be judged. The circuit is called here a signal detecting circuit and hereinbelow a case where the former detecting method is used will be explained. The frequency scanning is effected usually by applying a scanning voltage to a voltage controlled oscillator VCO acting as a local oscillator for frequency conversion, which is one of the elements constituting the AFC circuit. It is supposed that free-run frequency errors of the VCO and frequency errors of the frequency error detector are negligibly small and that frequency errors $f_{RCV}$ are only in the received frequency. It is supposed further that, when the signal is caught by the frequency scanning of the VCO and the signal detecting circuit responds thereto, the VCO is controlled so as to be deviated from the free-run frequency thereof by $f_{VCO}=e_2k_2$ ($e_2$ being a voltage (V) applied to the VCO, $k_2$ being a frequency control sensitivity (Hz/V) and that $e_1(V)$ is produced at this time at the output of the frequency error detector (frequency discriminator). Since errors in the IF frequency, which is the input signal to the frequency error detector, can be represented by $f_{IF}=f_{RCV}-f_{VCO}=e_1/k_1$ ($k_1$ being a frequency error detection sensitivity (V/Hz), the VCO is controlled so as to be deviated by a frequency $f_{RCV}\{K/(1+K)\}$ (K being a loop gain), which is almost equal to $f_{RCV}$ and finally remaining errors in IF should be $f_{IF}/(1+K)$.

Therefore the object of the present invention is to find an operating method for calculating a control voltage for deviating the VCO by $f_{RCV}\{K(1+K)\}$ in a period of time as short as possible on the basis of a condition (values of $e_1$, $e_2$ and K) at the point of time where the signal detector has been operated.

In the above explanation, the received frequency errors are expressed simply by $f_{RCV}$. This means, of course, the central frequency error. In reality, since the bit synchronizing signal, which is an FSK signal, enters the IF filter while being scanned in the frequency, at the beginning of the entrance there exists a condition where a part of the side band waves is cut. Consequently it is necessary to find a method for detecting the central frequency, starting from a signal, which is incomplete as an FSK signal. Therefore, for this reason, at first the output of the frequency discriminator (hereinbelow called demodulated output) will be explained.

The FSK signal dealt with in the present invention is an FSK signal called narrow deviation FSK, whose modulation index is below about 0.5. On the other hand, since the bit synchronizing signal is one in which information "1" and "0" are alternately repeated, it is converted into a sinusoidal wave by a roll-off filter and the carrier is frequency-modulated by using this signal.

A signal frequency-modulated by a sinusoidal wave can be represented by Equation 1, as well-known.

$$e(t)=A_0 \sin (\omega_c t + m_f \sin pt) \qquad \text{Equation 1}$$

where $A_0$ represents the amplitude of the carrier; $\omega_c$ the angular frequency of the carrier; and p the angular frequency of the modulated signal, in which, representing the data signal speed by $B_u$, $p=2\pi(B_u/2)$.

As well-known, this signal can be developed in side band wave components by using a Bessel function and when the modulation index is smaller than about 0.5, all the components of orders higher than the second order are negligibly small so that the signal can be expressed by Equation 2.

$$e(t) = A_0\{\sin \omega t + (m_f/2) \sin (\omega_c + p)t - (m_f/2) \sin (\omega_c - p)t\} \quad \text{Equation 2}$$

That is, it represents a spectrum having only three components, which are the carrier components (C), the first upper side band wave (USB) and the first lower side band wave (LSB). In Equation 2, it is supposed that $A_0 = 1$.

Since such a signal enters the IF filter while being scanned in the frequency, the three components constructing the spectrum enter it one after another from one end. Consequently, when the output thereof is observed as a function of time, as indicated in FIG. 1, there are three kinds of conditions, which are a condition a) under which only one wave of USB enters it, a condition b) under which two waves of USB+C enter it, and a condition c) under which all the three waves of USB, C and LSB enter it.

Therefore it is necessary to study the output of the frequency discriminator under the different conditions.

For the sake of simplicity, it is supposed here that under all the conditions the frequency is not scanned but fixed.

At first, since the signal is monotone under the condition a), constructed only by the USB, it is expressed as indicated by Equation 3 and the demodulated output $e_1(t)$ of this signal can be obtained by differentiating the phase component in Equation 3 with respect to time and expressed as indicated by Equation 4.

$$e(t) = (m_f/2) \sin (\omega_c + p)t \quad \text{Equation 3}$$

$$e_1(t) = (k_1/2\pi)(\omega_c + p) \quad \text{Equation 4}$$

Next, since the condition b) corresponds to USB+C, it can be expressed as indicated by Equation 5 and the demodulated output $e_1(t)$ for this signal is given by the second line of Equation 6. Supposing that the modulation index $m_f = 0.5$, it can be transformed approximately into the third line thereof.

$$e(t) = \sin\omega_c t + (m_f/2)\sin(\omega_c + p)t \quad \text{Equation 5}$$

$$= \sqrt{1 + (m_f/2)^2 + m_f\cos pt} \cdot$$

$$\sin\left\{\omega_c t + \tan^{-1}\frac{(m_f/2)\sin pt}{1 + (m_f/2)\cos pt}\right\}$$

$$e_1(t) = \frac{k_1}{2\pi}\frac{d}{dt}\phi(t) \quad \text{Equation 6}$$

$$= \frac{k_1}{2\pi}\frac{d}{dt}\left\{\omega_c t + \tan^{-1}\frac{(m_f/2)\sin pt}{1 + (m_f/2)\cos pt}\right\}$$

$$= \frac{k_1}{2\pi}\left\{\omega_c + p\frac{(m_f/2)^2 + (m_f/2)\cos pt}{1 + (m_f/2)^2 + m_f\cos pt}\right\}$$

$$= \frac{k_1}{2\pi}\left(\omega_c + p\frac{0.0625 + 0.25\cos pt}{1.0625 + 0.5\cos pt}\right) \quad (m_f = 0.5)$$

At last, since the condition c) is a condition under which there exist all the three components of the spectrum, i.e. it is that expressed by Equation 1 itself, the detection output thereof is given by Equation 7.

$$e_1(t) = \frac{k_1}{2\pi}\frac{d}{dt}(\omega_c t + m_f \sin pt) \quad \text{Equation 7}$$

$$= \frac{k_1}{2\pi}(\omega_c t + m_f p \cos pt)$$

$$= \frac{k_1}{2\pi}(\omega_c t + m_d \cos pt)$$

where $m_d$ represents the greatest deviation angular frequency.

As explained above, the demodulated output $e_1(t)$ can be expressed by either one of Equations 4, 6 and 7, depending on the spectrum passing through the IF filter.

In the real demodulated output, the scanning signal is superposed on the signal described above. Now, for the sake of convenience for the explanation, the following values are supposed.

The band width of the IF filter is 2 KHz (pass band from $F_L$ to $F_H$); the scanning speed is 1 KHz/100 ms; the data speed is 600 baud (therefore $p = 2\pi \cdot 300$); the modulation index $m_f = 0.5$ (therefore the greatest deviation angular frequency $m_d = 2\pi \cdot 150$); and the sensitivity of the frequency discriminator is 1 volt/1 KHz.

It is supposed that the frequency scanning is effected towards the higher frequency and that the signal detector does not work, even if the signal enters. The reference of the time being the point of time where the USB has reached the lower end $F_L$ of the IF filter, at 30 ms after the USB has entered, also the carrier C enters and at 30 ms further thereafter the LSB enters, too.

Figure 2:
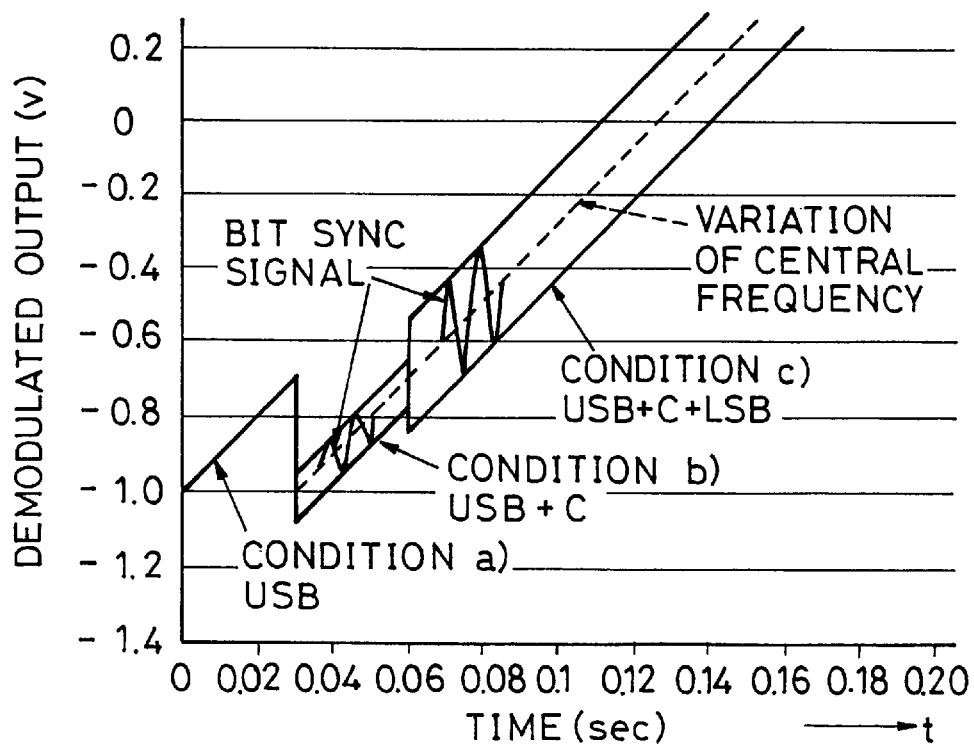
FIG. 2 is a diagram showing waveforms obtained when a bit synchronizing signal of a packet FSK signal during the frequency scanning is demodulated.

Under these conditions Equations 4, 6 and 7 being numerically calculated, the diagram indicated in FIG. 2 is obtained.

From FIG. 2 the following can be said.

In the case where the central frequency is detected, starting from the part corresponding to the condition a), in the present example, because of the correction due to the fact that the signal is detecting at a value higher by 300 Hz and because the level is lower by about 12 dB than the carrier component due to the fact that the signal includes only the USB component, the part cannot be used, if the signal is not strong enough.

In the case where it is detected, starting from the parts corresponding to the conditions b) and c), since the synchronizing signal is superposed thereon, it is necessary to take out the central frequency component therefrom.

As a method therefor, it can be thought to compensate the synchronizing signal component by integrating the signal over a period of time corresponding to one period of 300 Hz (1/300 sec). In the case where the part corresponding to the condition c) is used, since the synchronizing signal is demodulated as a correct sinusoidal wave, the central frequency component can be detected correctly by integrating it.

In the case where the part corresponding to the condition b), although the signal is demodulated not as a correct sinusoidal wave as indicated in FIG. 2, the central frequency component can be correctly detected for the reason described below. That is, since the demodulated output Equation 6 is obtained by differentiating the phase term of the IF signal Equation 5. The phase term given by Equation 5 can be obtained by integrating the demodulated output Equation 6. From Equation 5 it can be seen that both the denominator and the numerator in the arctangent repeat with a period of pt of $2\pi$. Consequently, since also the arctangent repeats similarly with a period of $2\pi$ (in the present case 1/300 sec), if it is integrated over 1/300 sec, the synchronizing signal component is compensated so that the central frequency component can be correctly detected.

From the above explanation there are two methods, depending on under which condition the signal from which it is detected is.

That is, the first method, which is such a method that it is detected from the signal in the condition a) and the central frequency error is obtained by subtracting a voltage corresponding to 300 Hz from the demodulated output voltage.

The second method, which is such a method that it is detected from the signal in the condition b) or c) and the central frequency error within the IF band is obtained by integrating the demodulated output signal over 1/300 sec.

Concretely speaking, by the first method, in the frequency scanning receiver having an AFC function for packet FSK signals, the frequency scanning is stopped when either one of the upper and lower one side band waves of the bit synchronizing signal of a desired signal is caught by the scanning and since frequency errors of the received signal and control remaining errors at the AFC convergence can be known from voltage and the control sensitivity of the voltage controlled oscillator for the scanning at that time as well as the detection voltage of the error detector corrected by a voltage corresponding to the frequency of the side band wave on the basis of the output voltage of the frequency discriminator and the detection sensitivity thereof, the method can be realized by calculating the control voltage applied to the voltage controlled oscillator at the convergence in this way to form it and by constructing the circuit so that the AFC circuit is made active after having applied this voltage to the voltage controlled oscillator.

By the second method, in the frequency scanning receiver having an AFC function for packet FSK signals, the frequency scanning is stopped when either one of the upper and lower one side band waves of the bit synchronizing signal and the carrier of a desired signal is caught by the scanning and since frequency errors of the received signal and control remaining errors at the AFC convergence can be known from the control voltage and the control sensitivity of the voltage controlled oscillator for the scanning at that time and the frequency error detection sensitivity of the frequency error detector integrating the output of the frequency discriminator over a 2 bit length, the method can be realized by calculating the control voltage applied to the voltage controlled oscillator at the convergence in this way to form it and by constructing the circuit so that the AFC circuit is made active after having applied this voltage to the voltage controlled oscillator.

Hereinbelow a preferred embodiment of the present invention will be explained, referring to the drawings.

Figure 3:
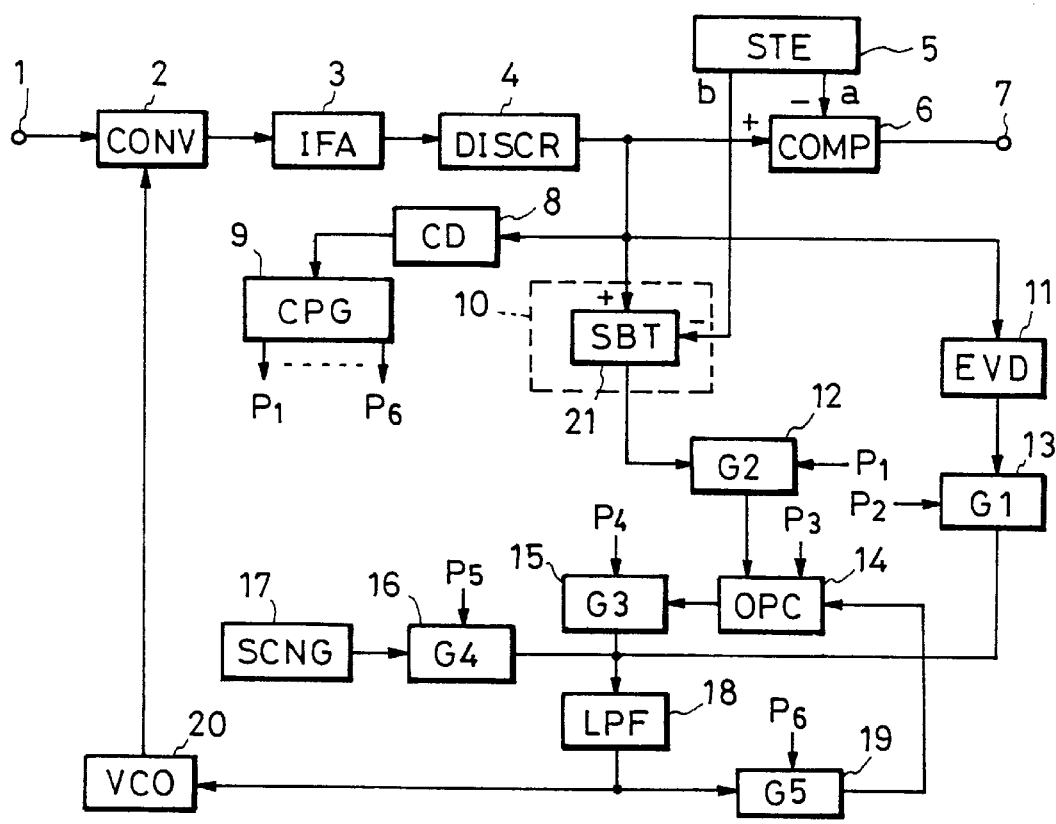
FIG. 3 is a diagram showing a circuit construction for explaining an embodiment of the present invention.

FIG. 3 is a circuit construction diagram indicating the embodiment of the present invention for realizing the first method. In FIG. 3, reference numeral 1 is a received signal input terminal; 2 is a frequency converter (CONV); 3 is an intermediate frequency amplifier (IFA) with an amplitude limiter; 4 is a frequency discriminator (DISCR); 5 is a reference voltage generator (STE); 6 is a comparator (COMP); 7 is a demodulated signal output terminal; 8 is a signal detector (CD); 9 is a control pulse generator (CPG); 10 is a dotted line frame enclosing an error voltage detecting circuit disposed specifically according to the present invention; 11 is an original error voltage detecting circuit (EVD) for AFC; 12 and 13 are gate circuits (G3, G4); 17 is a scanning signal generator (SCNG); 18 is a loop filter (LPF); 19 is a gate circuit (G5); 20 is a voltage controlled oscillator (VCO); and 21 is a subtracter (SBT). It is a matter of course that all the gate circuits, the comparator, analogue switches, etc. are circuits for analogue signals.

The received signal coming from the received signal input terminal 1 is applied to the frequency converter 2 and converted in the frequency by a local carrier from the voltage controlled oscillator 20 to be an IF signal. The IF signal is amplified by the intermediate frequency amplifier 3 and frequency-detected by the frequency discriminator 4 to be a base band signal, which is compared with a reference voltage by the comparator 6 to be a rectangular wave demodulated output. The demodulated base band signal is applied to the signal detector 8. When it is judged that an object signal has arrived, it drives the control pulse generator 9 to generate control pulses $P_1 \sim P_6$ which control operations of the different parts. The control pulse generator 9 generates various control pulses in output lines Of $P_1 \sim P_6$, as indicated in FIG. 4, to control the different gate circuits G1~G5 with a timing indicated in FIG. 4.

Figure 4:
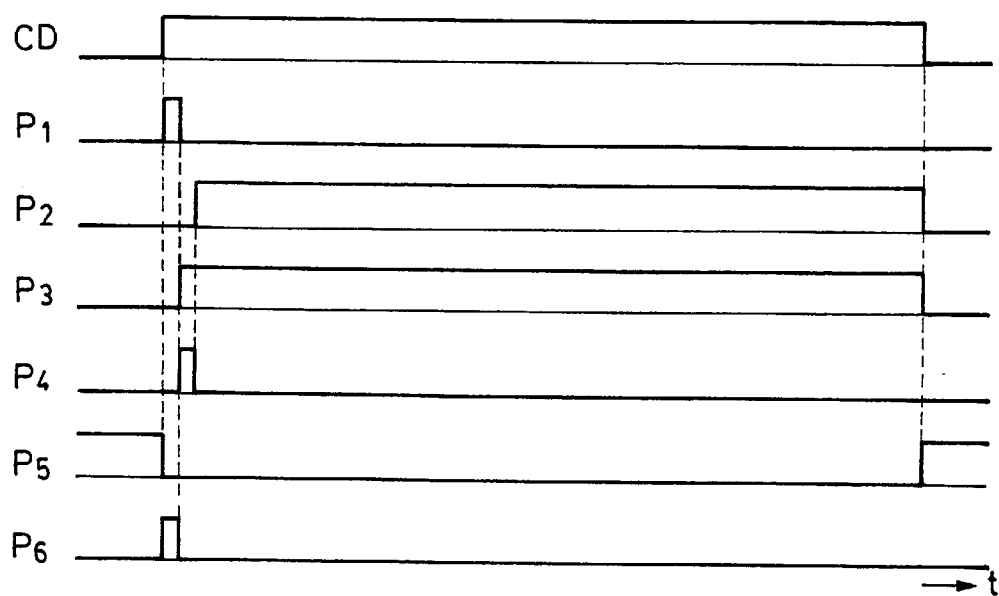
FIG. 4 is a diagram showing waveforms of pulses outputted by a control pulse generator for explaining an operation of the circuit construction indicated in FIG. 3.

CD on the uppermost step in FIG. 4 indicates the output of the signal detector 8 in FIG. 3. When the CD output is turned to H (High) by an input of an object signal, the scanning signal, which has been applied to the VCO from the scanning signal generator 17 through the gate circuit 16, is turned off due to the fact that the control pulse $P_5$ is turned to L (Low) and at the same time the control pulses $P_1$ and $P_6$ are outputted. The gate circuits G2 and G5 are turned on by these two pulses. At this time, the upper side band wave USB being frequency-detected, a voltage of $(f_{IF}+300 \text{ Hz}) \times k_1$ is outputted from the frequency discriminator 4. This voltage is applied to the error voltage detector 10. In the present case it is composed of the subtracter 21 and a reference voltage (300 Hz$\times k_1$) formed by the reference voltage generator 5 is subtracted here therefrom so that it is transformed into a voltage corresponding to $f_{IF} \times k_1$, i.e. $e_1$ described previously. This voltage is applied to the operating circuit 14 through the gate circuit 12 and at the same time the control voltage $e_2$ for the VCO 20 is applied also thereto through the gate circuit 19.

Operations required for the operating circuit 14 will be explained below. Here, for the sake of simplicity, it is supposed that factors relating to the loop gain of the AFC are only the discrimination sensitivity $k_1$ of the frequency discriminator and the control sensitivity $k_2$ of the VCO. Therefore the loop gain is $K=k_1 k_2$.

It has been described already that the VCO 20 may be controlled so that it is deviated by $f_{RCV}\{K/(1+k)\}$. Since $f_{RCV}=f_{VCO}+f_{IF}$, rewriting the above frequency in the VCO input voltage, it is $(f_{VCO}+f_{IF})k_1/(1+K)$. This is equal to $(f_{VCO}k_1/(1+K)+(f_{IF}k_1/(1+K)$ and since $f_{VCO}=e_2 k_2$ and $f_{IF}=e_1/k_1$, rewriting it by using them, this voltage is $(e_2 K1+K)+(e_1/(1+K))\approx e_2+e_1/K$.

Consequently, in the operating circuit 14, the voltage $e_2$ from the gate circuit 19 is added to the voltage $e_1$ from the gate circuit 12 divided by K and the voltage thus obtained is held by the control pulse $P_3$. This voltage is applied to the VCO through the gate circuit 15 controlled by the control pulse $P_4$ and the loop filter 18 so that the VCO is set at the above frequency. At the same time as this setting has been terminated, the gate circuit 13 is turned on by the control pulse $P_2$ so that the AFC loop effecting a stationary operation is formed.

This AFC loop is operated by the output of the error voltage detecting circuit 11. For this error voltage detecting circuit there are known various methods devised specifically for FSK signals (i.e. for detecting the central frequency $(f_1+f_0)/2$ without being influenced by durations of $f_1$ representing data "1" and $f_0$ representing data "0", however long they are). For realizing the present invention either one of the methods can be used and since it is sufficient that even the central frequency can be detected, explanation thereof will be omitted.

Now an embodiment of the second method, which works for the part corresponding to the conditions b) and c), will be explained. In this case, in the error voltage detector 10, the demodulated output is integrated over a 2 bit length of the bit synchronizing signal, i.e. over a period of 1/300 sec in the case of 600 baud described previously.

Figure 5:
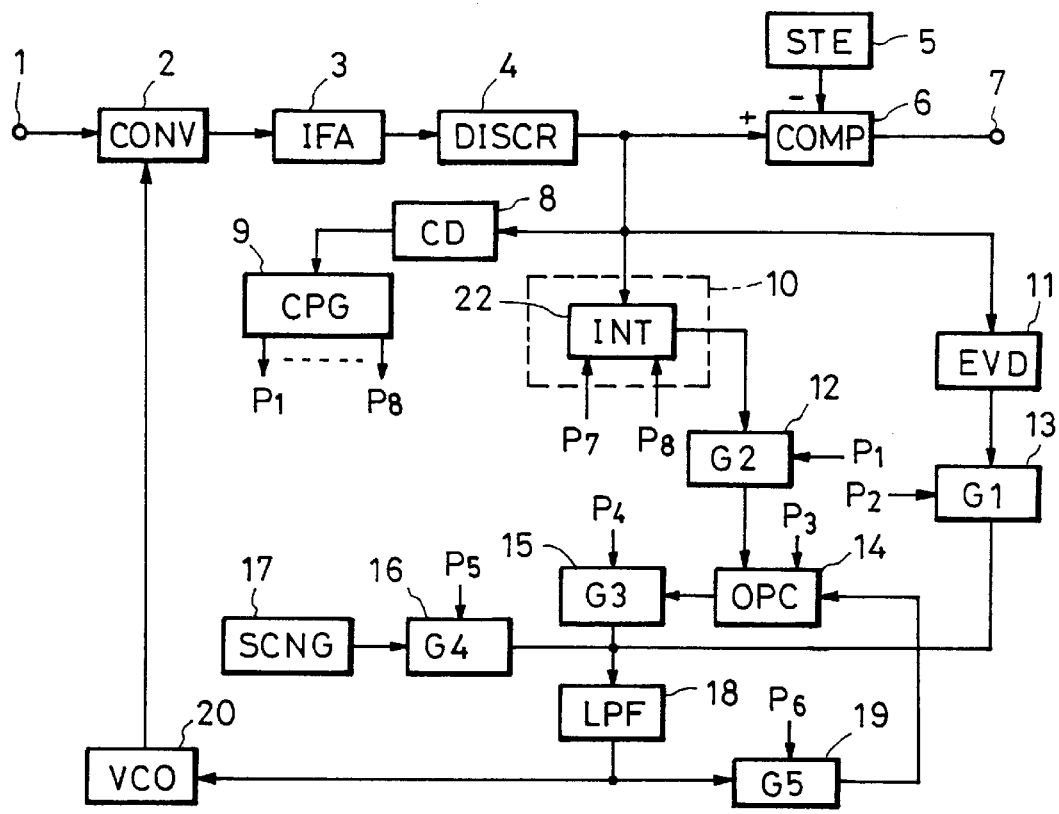
FIG. 5 is a diagram showing a circuit construction for explaining another embodiment of the present invention.

FIG. 5 is a circuit construction diagram in this case. In FIG. 5, only the construction and the operation of the error voltage detector 10 are different from those of the detector indicated in FIG. 3 and all the other parts are completely identical to those indicated in FIG. 3. 22 is an integrator INT and an example of construction thereof is indicated in FIG. 6A.

Figures 6A, 6B:
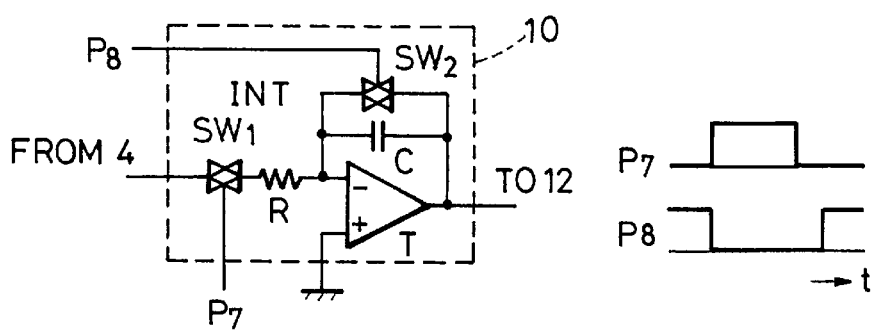
FIG. 6A is a diagram showing a concrete circuit construction of an integrator, which is a constituent element in the circuit construction indicated in FIG. 5.
FIG. 6B is a diagram showing waveforms for explaining an operation of the integrator indicated in FIG. 6A.

In FIG. 6A, R is a resistor, C is a capacitor; T is an operational amplifier; $SW_1$ and $SW_2$ are analogue switches. Waveforms of control pulses vary in the time, as indicated in FIG. 6B. The period of time, over which the integration is carried out, is determined by a pulse $P_7$. A pulse $P_8$ is used for discharging the integration voltage before the integration operation and after reading-out of the integration voltage. Therefore the reading-out of the integration voltage is effected before the pulse $P_7$ is turned to L and the pulse $P_8$ is turned to H.

Figure 7:
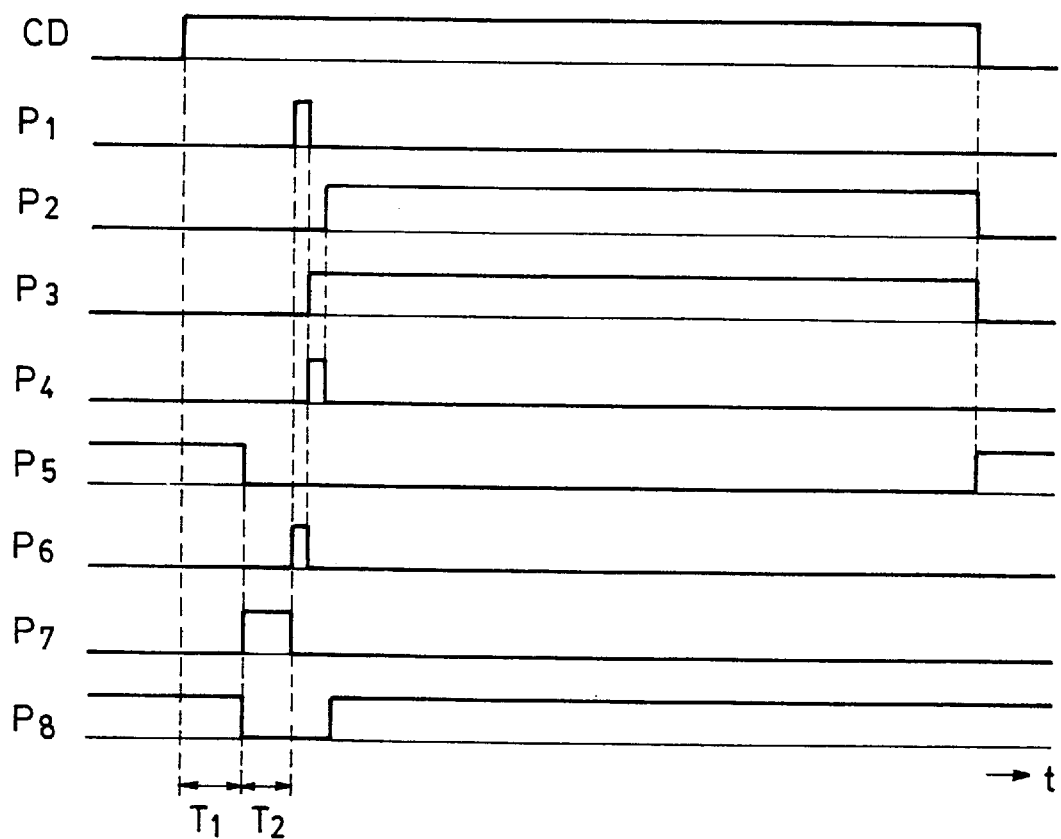
FIG. 7 is a diagram showing waveforms of pulses outputted by the control pulse generator for explaining an operation of the circuit construction indicated in FIG. 5.

The relation of this integration operation to the operation of the whole device in the time is as indicated in FIG. 7. What differs from the case indicated in FIG. 4 is that the frequency scanning is stopped at a time $T_1$ after the signal detector 8 has been turned on. By setting this time it is possible to decide under which condition b) or c) and where under that condition the frequency scanning is stopped. Since the error voltage with respect to the central frequency can be detected owing to this integration, the operation thereafter is identical to the case indicated in FIG. 3.

As explained in detail in the above, according to the present invention, since in the packet FSK receiver having an AFC function and a frequency scanning function it is possible to set the AFC circuit at a state of convergence in an extremely short period of time after an object signal is caught by the scanning, it is possible to shorten the header (bit synchronizing signal) of the packet signal and consequently to improve through put of transmitted data.

What is claimed is:

1. An AFC circuit for a frequency scanning FSK receiver, comprising:

a voltage controlled oscillator generating a frequency scanning signal;

a frequency converter generating an intermediate frequency signal having a frequency error signal, starting from a received signal and said frequency scanning signal;

a frequency discriminator detecting said frequency error signal;

a signal detector judging presence or absence of a desired received signal, based on a detection output of said frequency discriminator or an output of a signal strength indicator obtained from an intermediate frequency amplifier connected to said frequency converter;

in which a control voltage is given to said voltage controlled oscillator, responding to a judgment output of said signal detector, so as to stop frequency scanning and to make said AFC circuit active; and comprising further:

an integrator outputting a frequency error voltage, depending on a detection output of said frequency discriminator corresponding to a bit synchronizing signal of an object signal upon stopping the scanning;

an operating circuit, which calculates the control voltage at AFC convergence from said frequency error voltage and said control voltage applied to said voltage controlled oscillator, and transmits said control voltage to said voltage controlled oscillator; and an error voltage detecting circuit connected to said frequency discriminator and configured to operate an AFC loop.

2. An AFC circuit for a frequency scanning FSK receiver according to claim 1, wherein said integrator is constructed so as to output a frequency error voltage, depending on the detection output of said frequency discriminator corresponding to either one of an upper or a lower one side band of said bit synchronizing signal.

3. An AFC circuit for a frequency scanning FSK receiver according to claim 1, wherein said integrator is constructed so as to output a frequency error voltage obtained by integrating a detection output of said frequency discriminator corresponding to either one of an upper and a lower one side band of said bit synchronizing signal and a carrier over a 2 bit length.

* * * * *